United States Patent

Tanimoto et al.

[11] Patent Number: 6,110,608
[45] Date of Patent: Aug. 29, 2000

[54] LEAD MATERIAL FOR ELECTRONIC PART, LEAD AND SEMICONDUCTOR DEVICE USING THE SAME

[75] Inventors: Morimasa Tanimoto; Satoshi Suzuki, both of Nikko; Akira Matsuda, Utsunomiya; Kinya Sugie, Takatsuki, all of Japan

[73] Assignees: The Furukawa Electric Co., Ltd., Toyko; Kyowa Electric Wire Co., Ltd., Osaka, both of Japan

[21] Appl. No.: 08/987,318

[22] Filed: Dec. 9, 1997

[30] Foreign Application Priority Data

Dec. 10, 1996 [JP] Japan ............................ 8-329518

[51] Int. Cl.[7] ........................... H01V 23/48; B32B 15/01
[52] U.S. Cl. ....................... 428/647; 428/646; 257/772
[58] Field of Search .................... 428/643, 644, 428/645, 646, 647; 257/772; 439/886; 29/183.5

[56] References Cited

U.S. PATENT DOCUMENTS

| 3,162,512 | 12/1964 | Robinson | 29/199 |
| 4,014,660 | 3/1977 | Schreiner et al. | 29/183.5 |
| 4,441,118 | 4/1984 | Fister et al. | 428/643 |
| 4,830,933 | 5/1989 | Hodes et al. | 428/646 |
| 5,808,853 | 9/1998 | Dalal et al. | 361/306.1 |

FOREIGN PATENT DOCUMENTS

| 4-162460 | 6/1992 | Japan | 257/666 |
| 4-162461 | 6/1992 | Japan | 257/666 |

*Primary Examiner*—John J. Zimmerman
*Assistant Examiner*—Jason Resnick
*Attorney, Agent, or Firm*—Frishauf, Holtz, Goodman, Langer & Chick, P.C.

[57] ABSTRACT

A lead material for an electronic part having no adverse effect on the environment, having excellent solderability, desirable welding strength during welding and a low degree of nonuniform thickness of the plated layer during reflow processing. The lead material has a first plated layer and a second plated layer, both of which do not contain Pb, laminated on the surface of a conductive substrate in such order. The melting point of the second plated layer is lower than that of the first plated layer. The first and second plated layers are made of a Sn substance and a Sn alloy, respectively or vice versa.

11 Claims, 2 Drawing Sheets

LEAD MATERIAL FOR ELECTRONIC PART, LEAD AND SEMICONDUCTOR DEVICE USING THE SAME

BACKGROUND OF THE INVENTION

1. Field of the Invention

The present invention relates to a lead material for an electronic part, a lead and a semiconductor device using the same. More particularly, the present invention relates to a lead material for an electronic part wherein the surface of a conductive substrate is coated with a plated layer made of a Sn group material which does not contain Pb. The lead material does not give an adverse influence to the environment because it does not contain no Pb, and also has excellent solderability (or solder wettability) and provides a strong junction with a solder, and does not cause nonuniform thickness of the plated layer even in reflow processing.

2. Description of the Related Art

A lead material having a conductive substrate, such as a Cu substance or a Cu alloy, of which surface is coated with a plated layer made of a Sn substance or a Sn alloy represented by a solder, is a high-performance conductor which not only shows an excellent conductive property and mechanical strength based on the characteristics of the Cu substance or the Cu alloy, but also shows corrosion resistance and good solderability based on the characteristics of the Sn substance or the Sn alloy. The lead material is widely used in such field as electronic/electric equipment field as various types of terminals, connectors and leads or a power cable field.

When mounting semiconductor chips on a circuit board, the outer lead part of a semiconductor chip is subjected to solder by hot dipping or electroplating, thereby improving the solderability of the outer lead part.

However, in the above-stated lead material, if the plated layer coating the conductive substrate is made of a Sn substance, the following problems can occur.

First, Sn whiskers (acicular single crystals) grow up on the Sn plated layer thus formed, which cause a short-circuit accident. This problem can be solved by applying reflow-processing to the Sn plated layer.

Nonetheless, the melting point of the Sn substance is relatively high, i.e., 232° C., and the Sn plated layer is easily oxidized by the environment of the heat applied during a solder assembly step (i.e., a step of providing a purposed member by using a solder). Due to this, the solderability of the Sn plated layer disadvantageously deteriorates.

In the case of a lead wire for a condenser, padding is applied to the portion where the lead wire is welded to a welding target, for example, an aluminum wire. As a result, the plated layer becomes thicker. If the above-mentioned reflow processing is conducted on such a lead wire, the padding of the Sn plated layer becomes disadvantageously nonuniform in thickness.

Meanwhile, if a plated layer is made of a Sn alloy, no whiskers grow up unlike the Sn plated layer. The typical Sn alloy mentioned above is a solder (Sn-Pb alloy), and it has been widely used.

However, it is known that Pb contained in the solder has an adverse effect on human bodies. For that reason, in spite of its excellent properties, use of the solder is shunned. Recently, therefore, Sn alloys which do not contain Pb, that is, a Sn-Ag alloy, a Sn-Bi alloy, a Sn-In alloy and a Sn-Zn alloy have taken the place of the Pb-containing Sn alloy.

However, the lead material having a plated layer formed of any of those Sn alloys, has the following problems.

First, melting points of those alloys are relatively low. Due to this, Cu which is a constituent material for a conductive substrate thermally diffuses to the surface of the Sn alloy plated layer by heat applied during the solder assembly step, and resulting in the solderability of the Sn alloy plated layer to disadvantageously deteriorate.

Furthermore, when a lead wire is welded to, for example, an aluminum wire, the temperature of the welded portion is as close as 2000° C. in a moment and therefore elements such as Zn, Bi and In within the Sn alloy plated layer evaporate in a moment in the vicinity of the welded portion. As a result, blow holes are generated in the welded portion and the welding strength is lowered. Cu diffuses thermally from the conductive substrate to the welded portion and a Cu-Sn compound layer is formed on the surface of the lead material. This might cause a change in the color of the surface and deterioration of solderability.

Among those alloys exemplified as Sn alloys which do not contain Pb, the Sn-Ag alloy and the Sn-In alloy are expensive besides the above-stated disadvantages. The Sn-Bi alloy has low heat resistance to thereby cause the thermal diffusion of Cu in the conductive substrate and has a low bending property to thereby cause cracks to easily occur on the plated layer. The Sn-Bi alloy also has a disadvantage in that the junction strength of the junction part formed after soldering deteriorates as time passes. Moreover, the Sn-Zn alloy has low heat resistance.

OBJECTS AND SUMMARY OF THE INVENTION

It is therefore an object of the present invention to provide a lead material for an electronic part capable of solving the above-stated problems inherent to the conventional lead material which does not use a solder plated layer to thereby, for example, eliminate the adverse effect of Pb, having excellent solderability, having a welding strength of the part where the lead is welded to, for example, an aluminum wire, and preventing nonuniform thickness of the plated layer, even if the entire plated layer is made thick and reflow processing is conducted.

It is another object of the present invention to provide a lead manufactured by using the above-stated electronic lead material and further to provide a semiconductor device using the lead.

To attain the above objects, the present invention provides a lead material for an electronic part characterized in that:

a first plated layer and a second plated layer are provided on a surface of a conductive substrate in this order; and a melting temperature of a material for the second plated layer is lower than that of a material for the first plated layer.

Specifically, the present invention provides a lead material for an electronic part (to be referred to as a first lead material) wherein a first plated layer is made of a Sn substance and a second plated layer is made of a Sn alloy containing at least one element selected from a group of Ag, Bi, Cu, In and Zn. Alternatively, the present invention provides a lead material for an electronic part (to be referred to as a second lead material) wherein a first plated layer is made of a Sn alloy containing at least one element selected from a group of Ag, Cu, Sb and Y and a second plated layer is made of a Sn substance.

Moreover, the present invention provides a lead using the above-mentioned lead material for an electronic part and a semiconductor device using the lead.

DESCRIPTION OF THE PREFERRED EMBODIMENTS

Figure 1:
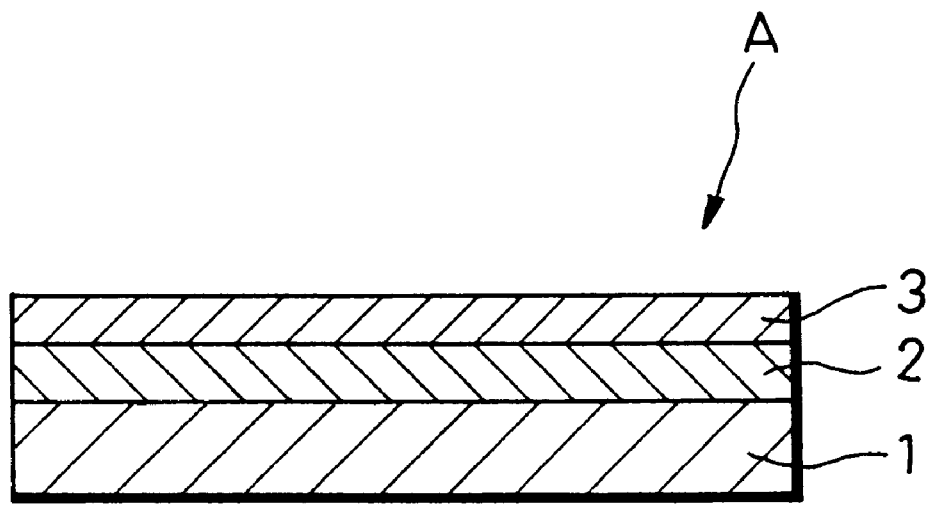
FIG. 1 is a sectional view showing an example of a lead material according to the present invention.

FIG. 1 is a cross-sectional view showing the fundamental structure of a lead material A according to the present invention. In FIG. 1, the lead material has a double-layer structure in which a first plated layer 2 and a second plated layer 3, which will be described later, are provided in this order on the surface of a conductive substrate 1. In the lead material A, the melting temperature (to be referred to as T2) of the uppermost layer, that is, the second plated layer 3 is lower than the melting temperature (to be referred to as T1) of the first plated layer 2 located below the second plated layer 3.

The material for the conductive substrate 1 of the lead material A may be optionally selected from materials at least of which surfaces are conductive, such as materials of the Cu group, the Fe group, the Ni group and the Al group. The materials are appropriately selected depending on the purpose of the lead material. Among those materials, at least constituent materials for the surface of conductive substrate 1 are preferably a Cu substance or a Cu alloy. In particular, if the lead material requires a large mechanical strength, it is preferable that a core is made of, for example, steel and a surface surrounding the core is coated with a layer of a Cu substance or a Cu alloy. If the lead material requires an excellent conductive property, the lead is preferably made of a Cu substance. The shape of the conductive substrate is not limited and it may be optionally rod-like, wire-like, bar-like, plate-like, tubular or the like.

The lead material A shows the following effect.

First, let is be assumed that the soldering temperature T satisfies the relationship expressed as T2≦T<T1 when soldering is conducted on the uppermost layer. In that case, even if the uppermost layer, that is, the second plated layer 3 is melted, the first plated layer 2 located below the second plated layer 3 is not melted. Due to this, the first plated layer 2 functions as a barrier against Cu and the like of being diffused from the conductive substrate 1 resulting from the heat applied during soldering. This makes it possible to prevent the solderability of the lead material A from deteriorating and therefore to realize a good junction strength between the lead material and the solder.

Let it be assumed that the thickness of the first plated layer 2 is t1 and the thickness of the second plated layer 3 is t2. In this case, although the entire thickness of the plated layers, that is, t1+t2 is large as a whole, thickness t2 is thinner, and the entire plated layers are subjected to reflow processing. In these conditions, it is possible to prevent the thick first plated layer 2 from melting while the thin second plated layer 3 is melted. This can prevent nonuniform thickness of the plated layers from occurring after the reflow processing.

The following modes can be proposed for the lead material according to the present invention.

The first lead material comprises a first plated layer 2 made of a Sn substance (melting point: 231.9° C.) and a second plated layer 3 made of a Sn alloy (I) containing at least one of the element selected from a group of Ag, Bi, Cu, In and Zn.

The second lead material comprises a first plated layer 2 made of a Sn alloy (II) containing at least one of element selected from a group of Ag, Cu, Sb and Y and a second plated layer 3 made of a Sn substance.

To be more specific, the lead material as described above has a double-layer structure in which one plated layer is made of a Sn substance and the other is made of a Sn alloy (I) or a Sn alloy (II). In the case of the first lead material, the uppermost second plated layer 3 is made of the Sn alloy (I) having a lower melting point than that of the Sn substance. In the case of the second lead material, the uppermost second plated layer 3 is made of a Sn substance and the first plated layer 2 is made of the Sn alloy (II) having a higher melting point than that of the first plated layer 2.

The first lead material will now be described in detail.

Sn alloys (I) for use for the first lead material may be multiple-element alloys including, for example, a Sn-In-Ag alloy, a Sn-Zn-In alloy and a Sn-Bi-Ag-Cu in addition to two-element alloys such as a Sn-Ag alloy, a Sn-Bi alloy, a Sn-Cu alloy, a Sn-In alloy and a Sn-Zn alloy. In those alloys, the alloy composition must be adjusted such that the melting temperature of any alloy is lower than that of a Sn substance.

In the case of the above-state two-element alloys, for example, the Sn-Ag alloy requires limiting the upper limit of the Ag percentage content to 5 wt %. The Sn-Bi alloy requires limiting that of the Bi percentage content to 87 wt %. The Sn-Cu alloy requires limiting that of the Cu percentage content to 2 wt % and the Sn-Zn alloy requires limiting the upper limit of the Zn percentage content to 12 wt %. If the percentage contents thereof exceed upper limits, respectively, melting temperatures thereof become higher than that of the Sn substance. If so, they are unsuitable for materials of the second plated layer 3 of the first lead material according to the present invention.

In the case of a Sn-In alloy, its melting temperature is lower than that of the Sn substance only by making In contain to Sn substance. For this reason, there is no limit to the upper limit of the In percentage content. However, if In is contained in an amount which is too much, when the second plated layer 3 is directly exposed to high temperature heat during the welding of the first lead material to, for example, an aluminum wire, the evaporated In causes blow holes to be generated at the welded part, thereby lowering the welding strength. It is therefore preferable that the In percentage content in the Sn-In alloy should be limited to 50 wt % or less.

As for the Sn-Bi alloy, the Bi percentage content up to 87 wt % is allowable in consideration of melting points. However, if the lead material a provides junction with a solder and 20 wt % or more Bi exists at the soldered part, the junction strength of the soldered part gradually deteriorates. Further, if the Sn-Bi alloy contains a considerable amount of Bi, blow holes are generated at the welded part as in the case of the In containing alloy and a welding strength is thereby lowered. Taking these respects into consideration, the alloy composition is preferably adjusted such that the Bi percentage content at the junction part after soldering is 20 wt % or less. Namely, using a Sn-Bi alloy having a Bi content of 30 wt % or less as the Sn alloy (I) is generally preferred, though this cannot be generalized because it depends upon the soldering condition.

Among the above-described Sn alloys (I), the Sn-Ag alloy and the Sn-In alloy are relatively expensive. The Sn-Zn alloy and the Sn-In alloy may experience color change due to oxidation during soldering and thereby deteriorate. Likewise, the Sn-Cu alloy may experience color change due to oxidation and therefore deteriorate. The Sn-Bi alloy is the most useful industrially. This is because the Sn-Bi alloy is less expensive among those Sn alloys (I) and excellent in oxidation resistance.

The second lead material will next be described in detail.

Sn alloys (II) for use in the second lead material may be multiple-element alloys including, for example, a Sn-Ag-Cu alloy and a Sn-Ag-Sb alloy, in addition to two-element alloys such as a Sn-Ag alloy, a Sn-Cu alloy, a Sn-Sb alloy and a Sn-Y alloy. In any case, the alloy composition must be adjusted such that the melting temperature of the alloy is higher than that of the Sn substance.

As regards the above-described two-element alloys, for example, the Ag percentage content of the Sn-Ag alloy can be set to 5 wt % or more and the Cu percentage content of the Sn-Cu alloy can be set to 2 wt % or more. In addition, when the Sn-Sb alloy and the Sn-Y alloy contain only Sb and Y, respectively, their melting temperatures are higher than that of the Sn substance. For that reason, there is no need to limit percentage contents of Sb and Y in consideration of the melting temperature.

However, if those elements are contained in the respective alloys too much, not only heat resistances thereof reach a saturated state, but also the costs of such alloys as a Sn-Ag alloy and a Sn-Y alloy increase. In the case of the Sn-Sb alloy, the first plated layer 2 is located below the uppermost Sn plated layer 3. Thus, there is a possibility that blow holes are generated during welding of the lead material to the aluminum wire, although less likely than the Sn alloy (I) of the first lead material. It is therefore preferable that the percentage contents of these elements in the Sn alloys (II) are set to 20 wt % ore less.

In both cases of the first least material and the second lead material, it is preferable that the thickness t1 of the first plated layer 2 is set to 1 to 15 μm, the thickness t2 of the second plated layer 3 is set to 0.5 to 5 μm and that the thickness t1 and t2 satisfy the relationship expressed as $t2/t1 \leq 1$.

If the thickness t1 of the first plated layer 2 is smaller than 1 μm, the first plated layer 2 does not effectively function as a barrier against Cu and the like being thermally diffused from the conductive substrate during soldering. Besides, the thickness t1 larger than 15 μm is not only wasteful, but also causes plating deformation in the formed plated layers to grow, whereby the plated layers are easily peeled off from the substrate and cracks occur.

If the thickness t2 of the second plated layer 3 is smaller than 0.5 μm, padding of the welded part cannot be conducted while the lead material is welded to, for example, an aluminum wire. If the thickness t2 is larger than 5 μm, nonuniform thickness of the plated layer might occur during, for example, reflow processing.

It is therefore preferable that the thickness t1 and the thicknesses t2 of the plated layers are set to fall within the above-stated ranges while the sum of the thicknesses (t1+t2) of the two plated layers is between 5 and 15 μm.

It is also preferable that the thickness t1 of the first plated layer 2 and the thickness t2 of the second plated layer 3 satisfy the relationship expressed as $t2/t1 \leq 1$, that is, the second plated layer 3 is thinner than the first plated layer 2.

The reasons are as follows. In the case of the first lead material, if the second plated layer 3 is formed of a Sn-Ag ally or a Sn-In alloy, it is possible to reduce costs without deteriorating the function of the lead material by making the expensive alloy plated layer thinner.

If the second plated layer 3 of the first lead material is formed of a Sn-Bi alloy, the first plated layer 2 is made thicker to prevent thermal diffusion of Cu and the like from the substrate. By doing so, while ensuring solderability of the Sn-Bi plated layer 3, the layer 3 is made thinner, thereby making it possible to provide a good bending property.

Furthermore, during, for example, soldering and reflow processing, or welding the lead material to, for example, an aluminum wire, if the two-layer structure plated layers are melted, then components such as Bi or Ag contained in a new plated layer formed during re-solidifying after melting are in the state of dilution by Sn. If, for example, the second plated layer of the first lead material is made of a Sn-Bi alloy, the Bi percentage content in the newly formed plated layer is decreased. Thus, by making the thickness (t2) of the second plated layer smaller, it is possible to decrease the Bi percentage content in the new plated layer and to thereby prevent junction strength of the junction part from gradually lowering after soldering.

In particular, in the case of the first lead material, it is preferable that the thickness of the second plated layer 3 is 40% or less of the entire thickness of the two-layer structure. In other words, the thickness t2 and t1 preferably satisfy the relationship expressed as $t2/t1 \leq 0.67$. This is because favorable characteristics can be obtained with respect to costs, solderability, heat resistance junction strength with solder and welding strength of welding part with aluminum wire.

As regards the thickness of the respective plated layers satisfying the above-stated relationship, it is further preferable that t1 is set to fall within the range of 6 to 10 μm, t2 is 1 to 3 μm and t2/t1 is 0.1 to 0.5 to further improve performance of the lead material.

The lead material according to the present invention can be fabricated by subjecting the surface of the conductive substrate 1 to electroplating or hot dipping, for example. At that time, if the surface of the conductive substrate 1 is preferably base-plated with Ni or Cu in advance, the base-plated layer effectively functions as a barrier to prevent thermal diffusion of Cu and the like from the conductive substrate 1. Thus, the base plated layers can have improved heat resistance and the lead material thus obtained is provided with excellent solderability. Particularly, it is useful if the second plated layer 3 is made of the Sn-Bi alloy of low melting point.

In the case of the lead material according to the present invention, plated layers are formed on the surface of the substrate and then reflow processing is preferably conducted to melt and re-solidify at least the second plated layer 3. This is particularly effective in the second lead material. The reason is that the second plated layer 3, that is, the Sn plated layer is melted and the surface is smoothed, thereby improving oxidation resistance and solderability.

At this time, it is preferable that at least part of the first plated layer 2 located below the second plated layer 3 is prevented from melting by temperature control. The reason why is that the lead material can be made uniform in thickness after reflow processing.

A lead wire fabricated using the above-stated material and a lead frame are examples of the lead provided by the present invention. A diode and a condenser using the above-stated lead material as a lead wire, or a lead frame on which IC components are mounted are examples of a semiconductor device provided by the present invention.

Figure 2:
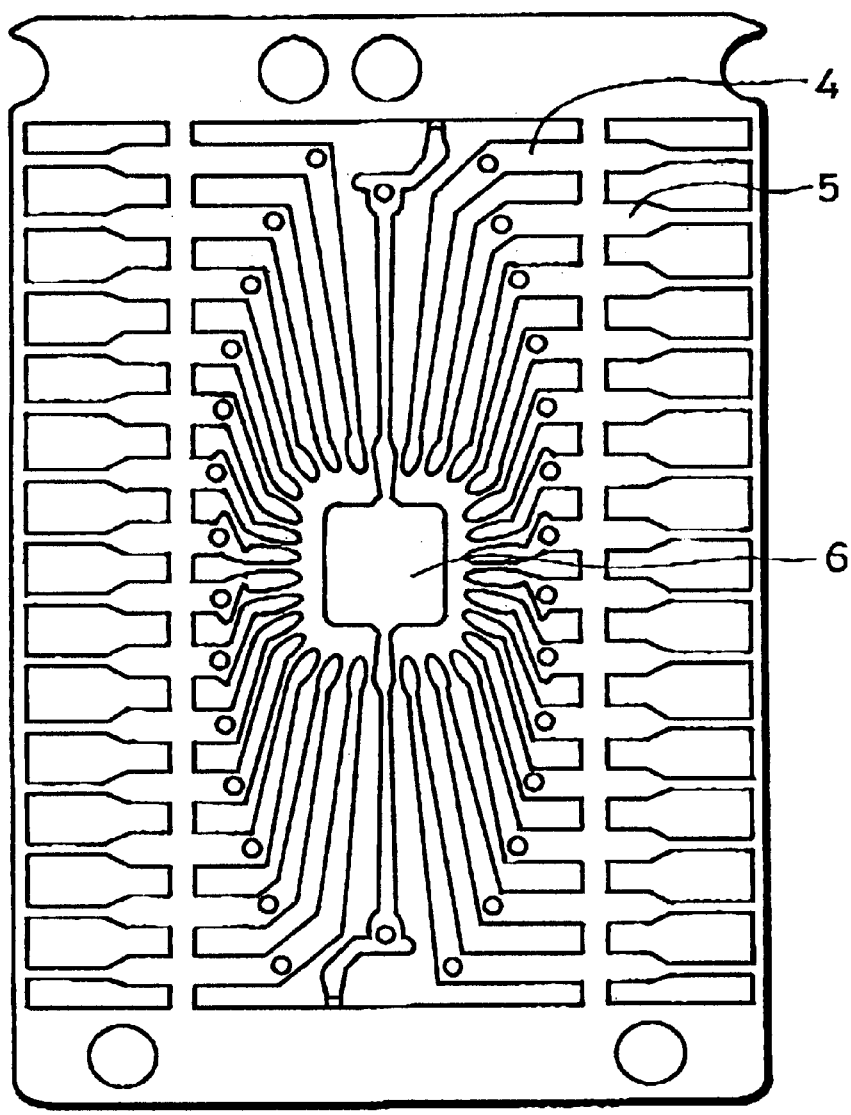
FIG. 2 is a plan view of a lead frame for a semiconductor device, exemplifying leads according to the present invention.
Figure 3:
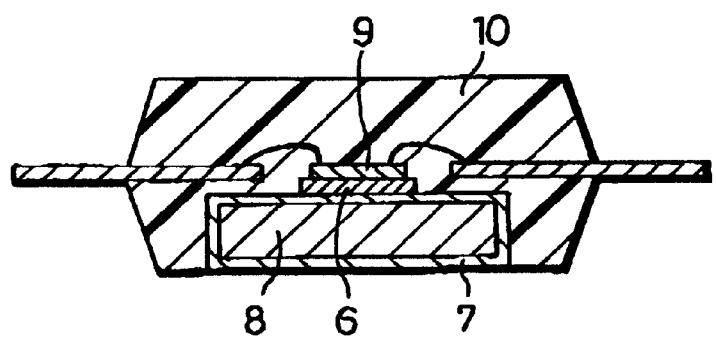
FIG. 3 is a sectional view of a semiconductor device having a semiconductor chip mounted on the lead frame of FIG. 2.

For example, in the plan view of FIG. 2 showing a lead frame for a semiconductor device according to the present invention, reference numeral 4 denotes an inner lead part, 5 denotes an outer lead part, and 6 denotes a die pad. An aluminum plate 8 coated with an insulating film 7 is placed beneath the die pad 6, and a semiconductor chip 9 is mounted on the die pad 6 with the inner lead part 4 sealed in a molded resin 10, thereby obtaining a semiconductor device of the present invention shown in FIG. 3.

thereby repeatedly providing the welded part to 90° bending. The swing frequency was counted in such a manner that the chuck was swung left and returned (first swing) and swung back right (second swing) and the like. The frequency from start until the welded part was broken was measured.

The evaluation results are shown in Table 1.

TABLE 1

| | First plated layer | | | Second plated layer | | | Entire plated layers | | Concentration of components other than Sn (wt %) | Characteristics | |
|---|---|---|---|---|---|---|---|---|---|---|---|
| | Type | Melting point (° C.) | Thickness ($t_1$:μm) | Type | Melting point (° C.) | Thickness ($t_2$:μm) | Entire thickness ($t_1 + t_2$: μm) | $t_2/t_1$ | | Solderability (%) | Welding strength |
| Example 1 | Sn | 232 | 6 | Sn-5% Bi | 228 | 4 | 10 | 0.67 | Bi:2 | 97 | 9 |
| Example 2 | Sn | 232 | 8 | Sn-50% Bi | 156 | 2 | 10 | 0.25 | Bi:10 | 99 | 7 |
| Example 3 | Sn | 232 | 5 | Sn-20% Bi | 209 | 1 | 6 | 0.2 | Bi:3 | 98 | 9 |
| Example 4 | Sn | 232 | 8 | Sn-10% Bi | 222 | 3 | 11 | 0.38 | Bi:3 | 97 | 9 |
| Example 5 | Sn | 232 | 5 | Sn-10% In | 213 | 3 | 8 | 0.6 | In:4 | 95 | 9 |
| Example 6 | Sn | 232 | 8 | Sn-1% Cu | 227 | 2 | 10 | 0.25 | Cu:0.2 | 92 | 10 |
| Example 7 | Sn | 232 | 8 | Sn-10% Zn | 212 | 4 | 12 | 0.5 | Zn:3 | 92 | 9 |
| Example 8 | Sn | 232 | 3 | Sn-20% Bi | 209 | 1 | 4 | 0.33 | Bi:5 | 98 | 8 |
| Example 9 | Sn | 232 | 6 | Sn-10% Bi | 222 | 6 | 12 | 1.0 | Bi:5 | 97 | 8 |
| Example 10 | Sn | 232 | 8 | Sn-7% Bi −3% Ag | 205 | 4 | 12 | 0.5 | Bi + Ag:3 | 97 | 9 |
| Example 11 | Sn | 232 | 6 | Sn-2% Bi | 230 | 4 | 10 | 0.67 | Bi:1 | 89 | 10 |
| Example 12 | Sn | 232 | 7 | Sn-80% Bi | 209 | 3 | 10 | 0.43 | Bi:24 | 90 | |
| Comparison example 1 | | | | Sn Plated layer (one layer only) (Thickness 10 μm) | | | | | | 85 | 10 |
| Comparison example 2 | | | | Sn-10% Bi Plated layer (one layer only) (Thickness 10 μm) | | | | | | 90 | 7 |
| Comparison example 3 | | | | Sn-10% Zn Plated layer (one layer only) (Thickness 10 μm) | | | | | | 89 | 6 |

EXAMPLES

Examples 1 to 12 and Comparison Examples 1 to 3

A first plated layer and a second plated layer shown in Table 1 were formed and a lead wire of the first lead material according to the present invention were manufactured by allowing a copper coated steel wire to sequentially travel in an electrolytic degreasing vessel, an acid cleaning vessel, a Sn plated vessel and a Sn alloy plated vessel.

After holding each of the lead wires within an air bath for 24 hours at 155° C., solderability (or solder wettability) and welding strength when welding the lead wire to an aluminum wire were evaluated with the following specifications.

Solderability: After dipped into a molten eutectic solder of a temperature of 230° C. for two seconds, the lead wire was pulled up and a solder wetted area was measured and the measured area with respect to a lead wire dipped area was expressed in percentage. The higher measured value indicates the more excellent solderability.

Welding strength when welding a lead wire to an aluminum wire: Welding strength was measured in accordance with JIS C 0051. Namely, the lead wire was welded to an aluminum wire. Thereafter, a load of one kilogram was suspended from the lead wire provided on the lower position, the aluminum wire was seized by a chuck and rollers were brought into contact with both sides of the welded part. In this state, the chuck was swung right and left alternately to give swing movement to the aluminum wire, The following characteristics can be seen form the Table 1.

(1) The lead material according to the present invention has good solderability and welding strength. As is evident from comparison of Examples 4, 5 and 7 where percentage contents of components other than Sn in the used Sn alloy (II) are equally 10 wt %, the lead material in Example 4 having the second plated layer made of a Sn-Bi alloy has better solderability than in any other Example, though they differ from one another in the thickness of the second plated layer. From this, it is obvious that the second plated layer of the first lead material, if made of a Sn-Bi alloy, is beneficial.

Even if the second plated layer is made of a Sn-Bi alloy, too high Bi percentage content leads to deterioration in solderability though welding strength is improved. Too low Bi percentage content also leads to deterioration in both solderability and welding strength. As can be understood from this fact, the Bi percentage content in the plated layer is preferably between 5 and 30 wt %.

(2) Comparison is made between Example 1 and Comparison Example 1. They are the same in the thickness of the plated layer located above the substrate, that is, 10 μm. Compared with Example 1, the welding strength is slightly improved, but the solderability greatly deteriorates in Comparison Example 1.

The reason the welding strength in Comparison Example 1 is improved more greatly than that in Example 1 is that the plated layer of Comparison Example 1 is made of a Sn substance and no other components causing blow holes during welding are included in the layer. Nonetheless, there exists only one plated layer and no barrier function to prevent Cu diffusion from the substrate during soldering is given. As a result, solderability greatly deteriorates in Comparison Example 1.

(3) As is obvious from a comparison of Example 4 and Comparison Example 2, and Example 7 and Comparison Example 3, it is useful to provide a Sn plated layer having a higher melting point than that of a Sn-10% Bi plated layer below the Sn-10% Bi plated layer (comparison of Example 4 with Comparison Example 2) and to provide a Sn plated layer having a higher melting point than that of a Sn-10% Zn plated layer below the Sn-10% Zn plated layer (comparison of Example 7 with Comparison Example 3).

Moreover, when the respective lead wires were left in the atmospheric environment for a long period of time, whiskers are generated in Comparison 1. However, no whiskers were seen on other lead wires having surfaces formed of Sn alloys.

The respective lead wires were subjected to reflow processing at a temperature of 750° C. at a feed rate of 50 to 70 m/minutes. No nonuniform thickness of the plated layer occurred to the lead wires having the thickness of the entire plate layers greater than 10 μm (Examples 4, 7 and 10) whereas it did in Comparison Example 1.

After the reflow processing, no whiskers are generated to the lead wires in the Examples 1 to 12, Comparisons Examples 1 to 3.

Examples 13 to 45 and Comparison Examples 4 and 5

As shown in Tables 2 and 3, a pure copper wire having a diameter of 0.6 mm was plated with Ni to form a base-plated layer of a thickness of 0.5 μm. Thereafter, the first plated layer and the second plated layer shown in Tables 2 and 3 were sequentially formed on the resultant base-plated layer.

Next, the respective wires were heated in an air bath at a temperature of 170° C. for 48 hours. Thereafter, under conditions shown in Tables 2 and 3, reflow processing was conducted thereto. After completion of the reflow processing, they were instantly subjected to water cooling to thereby re-solidify molten plated layers.

Solderability and the degree of nonuniform thickness of re-solidified layers of each of the obtained wires were measured with the following specifications.

Solderability: Same as Examples 1 to 12

The degree of nonuniform thickness of re-solidified layers after reflow processing: Wires were cut to a length of 10 cm and thickness of 30 points on the new plated layers were measured using fluorescent X-rays. The degree of nonuniform thickness of re-solidified layers in each case was expressed as a difference between a maximum thickness and a minimum thickness.

The results are shown in Tables 2 and 3.

TABLE 2

| | | Plated layer | | | | | Entire | | Reflow processing | | Characteristics | The degree of non-uniform in thickness |
|---|---|---|---|---|---|---|---|---|---|---|---|---|
| | Presence | First plated layer | | | Second plated layer | | plated | | | Feed | | |
| | of Ni base plated layer | Type | Melting point (° C.) | Thickness (t$_1$: μm) | Type | Melting point (° C.) | Thickness (t$_1$: μm) | layers thickness (t$_1$ + t$_2$: μm) | t$_2$/t$_1$ | Temperature (° C.) | rate (m/minute) | Solderability (%) | of re-solidifed layer (μm) |
| Example 13 | Present | Sn | 232 | 8 | Sn-7% Bi | 226 | 0.5 | 8.5 | 0.06 | 750 | 49 | 90 | 0.1 |
| Example 14 | Present | Sn | 232 | 8 | Sn-7% Bi | 226 | 1 | 9 | 0.13 | 750 | 50 | 95 | 0.1 |
| Example 15 | Present | Sn | 232 | 8 | Sn-7% Bi | 226 | 2 | 10 | 0.25 | 750 | 50 | 95 | 0.2 |
| Example 16 | Present | Sn | 232 | 8 | Sn-7% Bi | 226 | 4 | 12 | 0.5 | 750 | 51 | 90 | 0.2 |
| Example 17 | Present | Sn | 232 | 8 | Sn-7% Bi | 226 | 8 | 16 | 1 | 750 | 52 | 85 | 0.4 |
| Example 18 | Present | Sn | 232 | 8 | Sn-7% Bi | 226 | 12 | 20 | 1.5 | 750 | 53 | 85 | 0.6 |
| Example 19 | Present | Sn | 232 | 0.5 | Sn-7% Bi | 226 | 2 | 2.5 | 4 | 750 | 50 | 80 | 0.2 |
| Example 20 | Present | Sn | 232 | 1 | Sn-7% Bi | 226 | 2 | 3 | 2 | 750 | 50 | 80 | 0.2 |
| Example 21 | Present | Sn | 232 | 2 | Sn-7% Bi | 226 | 2 | 4 | 1 | 750 | 50 | 85 | 0.2 |
| Example 22 | Present | Sn | 232 | 4 | Sn-7% Bi | 226 | 2 | 6 | 0.5 | 750 | 50 | 90 | 0.2 |
| Example 23 | Present | Sn | 232 | 12 | Sn-7% Bi | 226 | 2 | 14 | 0.17 | 750 | 50 | 90 | 0.2 |
| Example 24 | Present | Sn | 232 | 18 | Sn-7% Bi | 226 | 2 | 20 | 0.11 | 750 | 50 | 85 | 0.2 |
| Example 25 | Present | Sn | 232 | 8 | Sn-3% Bi | 230 | 2 | 10 | 0.25 | 750 | 48 | 85 | 0.4 |
| Example 26 | Present | Sn | 232 | 8 | Sn-5% Bi | 228 | 2 | 10 | 0.25 | 750 | 49 | 90 | 0.2 |
| Example 27 | Present | Sn | 232 | 8 | Sn-10% Bi | 222 | 2 | 10 | 0.25 | 750 | 51 | 90 | 0.2 |
| Example 28 | Present | Sn | 232 | 8 | Sn-30% Bi | 192 | 2 | 10 | 0.25 | 750 | 55 | 90 | 0.1 |
| Example 29 | Present | Sn | 232 | 8 | Sn-60 Bi | 149 | 2 | 10 | 0.25 | 750 | 62 | 80 | 0.1 |

TABLE 3

| | Plated layer | | | | | | | | | Reflow processing | | | Characteristics |
|---|---|---|---|---|---|---|---|---|---|---|---|---|---|
| | Presence of Ni base plated layer | First plated layer | | | Second plated layer | | | Entire plated layers thickness $(t_1 + t_2: \mu m)$ | $t_2/t_1$ | Temperature (° C.) | Feed rate (m/minute) | Solderability (%) | The degree of nonuniform in thickness of re-solidifed layer $(\mu m)$ |
| | | Type | Melting point (° C.) | Thickness $(t_1: \mu m)$ | Type | Melting point (° C.) | Thickness $(t_1: \mu m)$ | | | | | | |
| Example 30 | Present | Sn | 232 | 8 | Sn-3% Ag | 223 | 2 | 10 | 0.25 | 750 | 48 | 85 | 0.2 |
| Example 31 | Present | Sn | 232 | 8 | Sn-10% In | 213 | 2 | 10 | 0.25 | 750 | 53 | 80 | 0.1 |
| Example 32 | Present | Sn | 232 | 8 | Sn-5% Zn | 207 | 2 | 10 | 0.25 | 750 | 42 | 80 | 0.3 |
| Example 33 | Present | Sn | 232 | 8 | Sn-3% Ag −7% Bi | | 2 | 10 | 0.25 | 750 | 55 | 90 | 0.1 |
| Example 34 | Not present | Sn | 232 | 8 | Sn-7% Bi | 226 | 2 | 10 | 0.25 | 750 | 50 | 90 | 02 |
| Example 35 | Not present | Sn | 232 | 4 | Sn-7% Bi | 226 | 2 | 6 | 0.5 | 750 | 50 | 85 | 0.2 |
| Example 36 | Present | Sn | 232 | 8 | Sn-7% Bi | 226 | 2 | 10 | 0.25 | — | — | 90 | Not measured |
| Example 37 | Present | Sn | 232 | 8 | Sn-10% Bi | 222 | 2 | 10 | 0.25 | — | — | 90 | Not measured |
| Example 38* | Present | Sn | 232 | 8 | Sn-7% Bi | 226 | 2 | 10 | 0.25 | 750 | 40 | 90 | 0.9 |
| Example 39 | Present | Sn-10% Ag | 304 | 4 | Sn | 232 | 1 | 5 | 0.25 | 750 | 43 | 85 | 0.3 |
| Example 40 | Present | Sn-10% Ag | 304 | 4 | Sn | 232 | 2 | 6 | 0.5 | 750 | 41 | 85 | 0.3 |
| Example 41 | Present | Sn-10% Ag | 304 | 4 | Sn | 232 | 4 | 8 | 1 | 750 | 40 | 85 | 0.8 |
| Example 42 | Present | Sn-10% Ag | 304 | 4 | Sn | 232 | 8 | 12 | 2 | 750 | 40 | 80 | 1.2 |
| Example 43 | Present | Sn-10% Ag | 304 | 4 | Sn | 232 | 4 | 8 | 1 | 750 | 40 | 85 | 0.9 |
| Example 44 | Present | Sn-2% Bi | 230 | 8 | Sn-10% Bi | 222 | 2 | 10 | 0.25 | 750 | 52 | 85 | 0.2 |
| Example 45 | Present | Sn-3% Ag | 223 | 8 | Sn-10% Bi | 222 | 2 | 10 | 0.25 | 750 | 52 | 90 | 0.3 |
| Comparison example 4 | Not present | Sn | 232 | 10 | — | — | — | 10 | — | 750 | 40 | 60 | 2.5 |
| Comparison example 5 | Not present | Sn-10% Bi | 222 | 10 | — | — | — | 10 | — | 750 | 55 | 40 | 0.3 |

*Pure copper bar instead of pure copper wire is used.

The following characteristics can be seen from the Tables 2 and 3.

(1) Solderability is 80 to 95% and the degree of nonuniform thickness of re-solidified layer is 0.1 to 1.2 μm in all Examples. Compared with Comparison Example 4 where there is only one Sn plated layer, solderability is considerably excellent and the degree of nonuniform thickness of re-solidified layer is small.

(2) The Examples 13 to 18 illustrate first lead materials which are the same in the first plated layer and different in the thickness of the second plated layer. If the second plated layer becomes thicker such that t2/t1 exceeds 1, solderability begins to deteriorate and the degree of nonuniform thickness of re-solidified layer begins to be large. Conversely, as in the case of Example 13, if the second plated layer becomes thinner such that t2/t1 is smaller than 0.1, the degree of nonuniform thickness of re-solidified layer is small but solderability begins to deteriorate. As can be seen from this, the thickness of the second plated layer preferably falls within the range of 0.5 to 5 μm.

(3) The Examples 19 to 24 illustrate first lead materials which are the same in second plated layer, but different in the thickness of the first plated layer. If the first plated layer is thinner, solderability deteriorates and thereby its function as a barrier is lowered. Conversely, however, if the first plated layer is too thick, solderability approaches a saturated state. As can be seen from this, the thickness of the first plated layer is preferably 1 to 15 μm.

(4) The Examples 25 to 29 illustrate first lead materials which are the same except for the different compositions of the Sn-Bi alloy forming the second plated layer. If the Bi percentage content is too high or too low, deterioration in solderability is recognized. In particular, if the Bi percentage content is 3 wt % (Example 25), the degree of nonuniform thickness of re-solidified layer becomes large. As can be seen from this, if the second plated layer is made of a Sn-Bi alloy, the Bi percentage content in the second plated layer is preferably 5 to 30 wt %.

(5) The Examples 30 to 33 illustrate first lead materials having different alloy compositions of the second plated layers. In every case, good solderability is recognized and so is the degree of nonuniform thickness of the re-solidified layer.

(6) Comparison is made between the Example 15 and the Example 34. They differ only in the presence of the Ni base-plated layer. The lead wire in the Example 34 where no Ni base-plated layer is formed have worse solderability. As is obvious from this, it is advantageous to form Ni base-plated layer.

(7) The Example 15 differs from the Example 36 in the presence of reflow processing. Solderability deteriorates if reflow processing is not conducted. As is obvious from this, it is advantageous to conduct reflow processing after the formation of plated layers.

(8) The Examples 39 to 43 illustrate second lead materials having the first plated layers made of high melting point Sn alloy (II). In every case, good solderability and good degree of nonuniform thickness are recognized. As a whole, however, the solderability tends to be lower and the degree of nonuniform thickness tends to be large than the case of the first lead materials.

(9) The Examples 44 and 45 illustrate that the first plated layer is made of a high melting point Sn alloy (II) and the second plated layer is made of a low melting point Sn alloy (I). In every case, good solderability is recognized.

As can be understood from the above description, the plated layers of the lead material according to the present invention do not contain Pb and therefore no adverse effect is given to the environment.

Furthermore, the plated layers are two layer structure of a first plated layer having a high melting point and a second plated layer having a lower melting point than that of the first plated layer. Even if the second plated layer is melted during soldering, the first plated layer functions as a barrier to prevent thermal diffusion of Cu and the like from the substrate resulting from the heat at the time of melting. As a result, solderability is improved.

As regards the first lead material, even if the second plated layer is made of an expensive alloy such as a Sn-Ag alloy and a Sn-In alloy, low manufacturing costs can be maintained by making the first plated layer (or Sn plated layer) thicker and making the second plated layer thinner. In addition, the thinner second plated layer leads to a decrease in the degree of nonuniform thickness of the re-solidified layer after reflow processing.

What is claimed is:

1. A lead material for an electronic part comprising
a first plated layer laminated on a surface of a conductive substrate, a second plated layer laminated on said first plated layer, a material for said second plated layer having a lower melting temperature than a material for said first plated layer,
wherein said first plated layer is made of a Sn substance and said second plated layer is made of a Sn alloy containing at least one element selected from the group consisting of Ag, Bi, Cu, In and Zn.

2. A lead material for an electronic part according to claim 1, wherein
said first plated layer has a thickness of $t1$ and said second plated layer has a thickness of $t2$, the thickness $t1$ and the thickness $t2$ satisfy a relationship expressed as
1 μm$\leq t1 \leq$15 μm, 0.5 μm$\leq t2 \leq$5 μm and
$t2/t1 \leq 1.0$.

3. A lead material for an electronic part according to claim 2, wherein
the thickness $t1$ and the thickness $t2$ satisfy a relationship expressed as
5 μm$\leq t1+t2 \leq$15 μm.

4. A lead material for an electronic part according to claim 1, wherein
at least said second plated layer is subjected to reflow processing.

5. A lead material for an electronic part according to claim 2, wherein
at least said second plated layer is subjected to reflow processing.

6. A lead material for an electronic part according to claim 3, wherein
at least said second plated layer is subjected to reflow processing.

7. A lead comprising a lead material for an electronic part as recited in any one of claims 1, 2, 3, 4, 5 and 6.

8. A semiconductor device having a lead comprising a lead material for an electronic part as recited in any one of claims 1, 2, 3, 4, 5 and 6.

9. A lead material for an electronic part according to claim 1, wherein $t1$ is 6 to 10 μm, $t2$ is 1 to 3 μm and $t2/t1$ is 0.1 to 0.5; and the Sn alloy is Sn-Bi with a Bi content of 30 wt % or less.

10. A lead material for an electronic part according to claim 1, wherein $t1$ is 6 to 10 μm, $t2$ is 1 to 3 μm and $t2/t1$ is 0.1 to 0.5.

11. A lead material for an electronic part according to claim 1, wherein each of the first plated layer and the second plated layer do not contain Pb.

* * * * *